United States Patent [19]

Stevens et al.

[11] Patent Number: 5,618,651
[45] Date of Patent: Apr. 8, 1997

[54] IMAGING ELEMENT WITH A FLEXIBLE SUPPORT AND METHOD FOR MAKING A LITHOGRAPHIC PRINTING PLATE

[75] Inventors: Marc Stevens, Belsele; Johan Van Hunsel, Hasselt; Jos Vaes, Betekom, all of Belgium

[73] Assignee: AGFA-Gevaert, N.V., Mortsel, Belgium

[21] Appl. No.: 593,452

[22] Filed: Jan. 29, 1996

Related U.S. Application Data

[63] Continuation-in-part of Ser. No. 453,832, May 30, 1995, abandoned.

[30] Foreign Application Priority Data

Aug. 22, 1994 [EP] European Pat. Off. .............. 94202380

[51] Int. Cl.⁶ .............. G03F 7/07; G03C 1/795; G03C 8/06; G03C 8/52
[52] U.S. Cl. .............. 430/204; 430/227; 430/229; 430/533; 101/453
[58] Field of Search .............. 430/204, 227, 430/533, 229; 101/453

[56] References Cited

U.S. PATENT DOCUMENTS

| | | | |
|---|---|---|---|
| 4,732,840 | 3/1988 | Hasegawa | 430/330 |
| 5,227,275 | 7/1993 | Miyazu et al. | 430/533 |
| 5,281,509 | 1/1994 | Murakata et al. | 430/204 |
| 5,294,473 | 3/1994 | Kawamoto | 430/533 |
| 5,326,689 | 7/1994 | Murayama | 430/533 |
| 5,368,997 | 11/1994 | Kawamoto | 430/533 |
| 5,393,652 | 2/1995 | Marui | 430/533 |
| 5,401,611 | 3/1995 | Edwards et al. | 430/964 |
| 5,436,123 | 7/1995 | Suzuki | 430/533 |
| 5,437,963 | 8/1995 | Verburgh | 430/964 |
| 5,468,588 | 11/1995 | Macioch et al. | 430/204 |
| 5,496,679 | 3/1996 | Hauquier et al. | 430/204 |

*Primary Examiner*—Richard L. Schilling
*Attorney, Agent, or Firm*—Breiner & Breiner

[57] ABSTRACT

There is provided an imaging element having a flexible support and comprising on said support a photosensitive layer comprising a silver halide emulsion and an image-receiving layer comprising physical development nuclei, said layers being in water permeable contact with each other, characterized in that said flexible support is a polyester film having a thickness between 0.15 and 0.35 mm and consisting of polyethylene 2,6-naphthalenedicarboxylate. There is also provided a method for making a lithographic printing plate comprising the steps of image-wise exposing an imaging element as defined above and subsequently developing a thus obtained imaging element by an alkaline processing liquid in the presence of developing agent(s) and silver halide solvent(s).

6 Claims, No Drawings

1

IMAGING ELEMENT WITH A FLEXIBLE SUPPORT AND METHOD FOR MAKING A LITHOGRAPHIC PRINTING PLATE

DESCRIPTION

This is a continuation-in-part of the U.S. patent application Ser. No. 08/453,832 filed May 30, 1995.

1. FIELD OF THE INVENTION

The present invention relates to an imaging element, for making improved lithographic printing plates according to the silver salt diffusion transfer process, in particular to an imaging element having a polyester support.

The present invention further relates to a method for making improved lithographic printing plates according to the silver salt diffusion transfer process.

2. BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image-receiving layer of a sheet or web material which is a separate element with respect to the photographic silver halide emulsion material (a so-called two-sheet DTR-element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

Supports that are commonly used for lithographic printing plates are metal supports such as e.g. aluminum and flexible supports such as e.g. paper or organic resin supports such as e.g. polyester. Metal supports are generally used for high quality printing and print jobs that require a large number of copies, typically around 100000. Lithographic printing plates having a flexible support are generally used for print jobs requiring a medium print quality and only a limited number of copies typically around 10000.

An important problem that occurs with lithographic printing plates having a flexible support is that during startup of the printing process the plate tends to enlarge somewhat until an equilibrium state is reached. As a consequence the first copies will not be of acceptable quality and have to be disposed of. This problem is particular apparent when images having continuous tones in particular color images have to be reproduced.

EP-A 674227 discloses that the number of copies that have to be disposed of at the start of the printing job when using a printing plate obtained from an imaging element according to the DTR-process having a flexible support can be reduced by using as a support of the imaging element a polyester film e.g. a polyethylene therephthalate film having a thickness between 0.1 mm and 0.35 mm and having a Young-modulus (E-modulus) of at least 4300N/mm$^2$. Although printing plates obtained from said imaging elements give a better result, there is clearly still room for further improvement.

3. SUMMARY OF INVENTION

It is an object of the present invention to provide an imaging element having a flexible support and method for making a printing plate therewith, said printing plate having improved lithographic printing properties in particular a reduced number of copies that have to be disposed of at the start of the printing job.

Further objects of the present invention will become clear from the description hereinafter.

According to the present invention there is provided an imaging element having a flexible support and comprising on said support a photosensitive layer comprising a silver halide emulsion and an image-receiving layer comprising physical development nuclei, said layers being in water permeable contact with each other, characterized in that said flexible support is a polyester film having a thickness between 0.15 and 0.35 mm and consisting of polyethylene 2,6-naphthalenedicarboxylate.

According to the present invention there is also provided a method for making a lithographic printing plate comprising the steps of image-wise exposing an imaging element as defined above and subsequently developing a thus obtained imaging element by an alkaline processing liquid in the presence of developing agent(s) and silver halide solvent(s).

4. DETAILED DESCRIPTION OF THE INVENTION

It has been found that the number of copies that have to be disposed of at the start of the printing job when using a printing plate prepared from an imaging element according to the DTR-process with a flexible support can be reduced by using as a support of the printing plate a polyester film having a thickness between 0.15 mm and 0.35 mm and consisting of polyethylene 2,6-naphthalenedicarboxylate.

The polyester film according to the invention has a thickness between 0.15 mm and 0.35 mm, preferably between 0.20 mm and 0.30 mm.

The support in accordance with the present invention has preferably a sum of the E-moduli measured in the machine direction (longitudinal direction) and the direction perpendicular thereto (transverse direction) of at least 9500N/mm$^2$ and more preferably of at least 10000N/mm², at least one of said Young-moduli preferably being at least 5100N/mm².

The Young-moduli also called E-moduli in connection with the present invention can be measured according to method A of the ANSI-D882-91 standard. The Young-moduli are expressed in Newton/mm², Newton (internationally accepted abbreviation N) being the unit of force in the meter-kilogram-second system, equal to the force which will impart an acceleration of 1 meter per second squared to the International Prototype Kilogram mass. (Dictionary of scientific and technical terms, page 1271—Mc Graw-Hill—New York)

According to the most preferred embodiment of the present invention the polyester film support is isotropic in the E-modulus i.e. the ratio of E-modulus in longitudinal direction to the transverse direction is between 0.8 and 1.2. The use of an isotropic polyester film support offers the advantage that when the plate is turned 90° the same printing properties are obtained so that manufacturing of different sizes of the printing plates out of a master roll is simplified.

Such isotropic supports also offer an advantage when the imaging element is to be used in an image-setter for high intensity short time exposure. In this application, several images on one printing plate may be oriented parallel and/or perpendicular to the axis of the printing cylinder ill the printing machine. When an isotropic polyester film support is used it will be much easier to obtain a steady print.

On the other hand, when an anisotropic polyester film support is used a larger E-modulus can be obtained (more than 6000N/mm²) because a large E-modulus in one direction generally goes to the detriment of the E-modulus in the direction perpendicular thereto. In order to obtain the benefit of an anisotropic polyester film support, such printing plate should be mounted with its highest E-modulus perpendicular to the axis of the printing cylinder of the printing press.

The polyester film in accordance with the present invention may be uniaxially oriented but is preferably biaxially oriented. The desired E-modulus may be obtained by setting the degree of orientation of the polyester film. Preferably, the degree of orientation is obtained by stretching the polyester film in the longitudinal and/or transverse direction with a factor between 1:2 to 1:5.

The E-modulus may further be influenced by adding substances to the polyester film such as e.g. low molecular weight compounds, voiding agents such as e.g. $BaSO_4$, polypropylene and opacifying agents such as e.g. $TiO_2$.

In general the polyester film support in accordance with the present invention is treated in order to improve the adhesion of a hydrophilic layer. Said support can be treated with a corona discharge. Preferably said support is coated with a layer improving the adhesion of the hydrophilic layers.

A particularly suitable adhesion improving layer comprises a copolymer containing water-soluble monomers and water-insoluble monomers in a molar ratio between 1:99 and 20:80. Preferably the water soluble monomer is a monomer having one or more carboxylic acid groups. An example of an especially preferred copolymer for use in said adhesion improving layer is a polymer containing 1% to 10% by weight, more preferably 1% to 5% by weight of iraconic acid. Suitable polymers containing iraconic acid are e.g. copolymers of iraconic acid and vinylidene chloride, copolymers of iraconic acid, vinylidene chloride and-vinylacetate, copolymers of iraconic acid, vinylidene chloride and methyl (meth)acrylate, copolymers of iraconic acid and vinyl chloride, copolymers of iraconic acid, vinyl chloride, vinylidene chloride and methyl(meth)acrylate etc. . . . Particularly preferred copolymers of iraconic acid, vinylidene chloride and optionally methyl(meth)acrylate are those wherein the amount of itaconic acid is between 1% and 5%, the amount of vinylidene chloride is between 70% and 95% and the amount of methyl(meth)acrylate is between 0% and 15%. The adhesion improving layer is preferably free of gelatin.

On top of this adhesion improving layer there may be provided a further intermediate layer containing microparticles having an average diameter of less than 50 nm, preferably colloidal silica and gelatin preferably in a weight ratio between 1:2 and 2:1.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

According to the present invention the emulsion or emulsions preferably consist principally or totally of silver chloride while a fraction of silver bromide is preferably present ranging from 0.1 mole % to 40 mole %. The emulsions containing more than 5 mole % of silver bromide preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 μm, preferably from 0.25 to 0.45 μm.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The silver halide emulsions may contain the usual stabilizers e.g. azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions can be found in e.g. Product Licensing Index, Vol. 92, December 1971, publication 9232, p. 107–109.

Apart from negative-working silver halide emulsions that are preferred for their high light-sensitivity, use can be made also of direct-positive silver halide emulsions that produce a positive silver image.

For instance, direct-positive silver halide emulsions that mainly forms an internal image as described in e.g. EP-A 365,926 and U.S. Pat. No. 3,062,651 may be employed. Alternatively, prefogged direct-positive silver halide emulsions with internal or, more preferably, with external electron traps as disclosed in EP-A 481,562 are also suitable for use in connection with the present invention.

For instance, direct-positive emulsions of the type described in U.S. Pat. No. 3,062,651 may be employed. In direct-positive emulsions a non-hardening fogging agent such as stannous chloride and formamidine sulphinic acid can be used.

The layer containing physical development nuclei can be free of hydrophilic binder but preferably comprises an amounts up to 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

The layer containing physical development nuclei is in waterpermeable contact with the photosensitive silver halide emulsion layer. Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

In connection with the present invention two layer arrangements can be used for obtaining an imaging element suitable for making a lithographic printing plate according to the DTR-process.

According to a first arrangement the polyester support in accordance with the present invention is provided in the order given with a silver halide emulsion layer and an image receiving layer. Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2–10 µm and more preferably between 2 µm and 5 µm. The matting agents are generally used in a total amount in the imaging element of 0.1 g/m² to 2.5 g/m². At least part of these matting agents and/or light reflection pigments may also be present in the silver halide emulsion layer the most part, preferably at least 80% by weight however preferably being present in said base-layer. As a further alternative the light reflecting pigments may be present in a separate layer provided between the antihalation layer and the photosensitive silver halide emulsion layer. Like the emulsion layer the base layer is coated preferably at a pH value near the isoelectric point of the gelatin in the base layer.

In a preferred variant of this embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a multiple layer pack e.g. a double layer pack.

According to a preferred embodiment in connection with the present invention the roughness of the backing layer package is adjusted such that an arithmetical mean deviation of profile $R_a$ of more than 0.7 is obtained. $R_a$ being obtained in accordance with the following formula:

$$R_a = (1/m) \cdot \int_0^m |f(x)| \, dx \, (\mu m)$$

with $m$ being 0.8

The profile of said backing layer package is measured with a perthometer Mahr Perthen S6P containing as measuring head RTK 50 (tradenames of Feinpruef Perthen GmbH, Goettingen, Germany) equipped with a diamond stylus with a diameter of 5 µm under a pressure of 1.0 mN.

When the $R_a$-value of the back of the printing plate is less than 0.7 the number of copies that have to be disposed of at the start of the printing process will generally be larger. However, if $R_a$ is below 0.15 an improvement may be obtained when the back of the printing plate is at least partially wetted when mounting it on the printing cylinder.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis (sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

The imaging element used according to the present invention may further comprise various kinds of surface-active agents in the photographic emulsion layer or in at least one other hydrophilic colloid layer. Examples of suitable surface-active agents are described in e.g. EP-A 545452. Preferably compounds containing perfluorinated alkyl groups are used.

The imaging element of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and sltyrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

The above described DTR mono-sheet imaging element in connection with the present invention is exposed in an apparatus according to its particular application, e.g. a conventional process camera containing a conventional light source or a high intensity short time exposure such as e.g. a laser containing device. Subsequently the imaged element is developed with an alkaline processing liquid in the presence of developing agent(s) and silver halide solvent(s).

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are of the phenidone type e.g. 1-phenyl-3-pyrazolidone, 1-phenyl-4-monomethyl-3-pyrazolidone, and 1-phenyl-4,4-dimethyl-3-pyrazolidone. However other developing agents can be used. Said developing agents may be contained in an alkaline processing liquid but are preferably contained in one or more layers of the photographic element. In the latter case the alkaline processing liquid merely serves as an alkaline activating liquid.

The pH of said alkaline liquid is preferably between 9 and 14, more preferably between 10 and 13 and may be established by an organic and/or inorganic alkali agent. Examples of suitable alkali agents are e.g. sodium hydroxide, carbonates, phosphates, alkanolamines or mixtures thereof.

The alkaline processing liquid preferably also contains a preserving agent having antioxidation activity, e.g. sulphite ions. Further may be present a thickening agent, fog inhibiting agents e.g. a benzotriazole which is known to improve the printing endurance, calcium-sequestering compounds, anti-sludge agents, development accelerators and hardeners including latent hardeners.

Suitable silver complexing agents also called silver halide solvents for use in accordance with the present invention are e.g. thiosulphate or thiocyanate in an amount ranging from 5 g to 50 g per liter. Other interesting silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers, preferably dior poly-thioethers as disclosed in e.g. U.S. Pat. No. 4,960,683 and EP-A 554,585.

Still further suitable silver halide solvents are meso-ionic compounds, preferably 1,2,4-triazolium-3-thiolates.

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

The development step is preferably followed by a neutralization of the surface of the imaged element by guiding the element through a neutralization liquid having a pH between 4 and 7. The neutralization liquid preferably contains a buffer e.g. a phosphate buffer, a citrate buffer, an amine or a mixture thereof. The neutralization solution can further contain bactericides, e.g. phenol, thymol or 5-bromo-5-nitro-1,3-dioxan as described in EP-150,517, wetting agents e.g. saponins or pluronics etc.. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

To improve the differentiation between the hydrophobic silver image and the hydrophilic background the alkaline processing liquid and/or neutralization liquid preferably contain one or more hydrophobizing agents, e.g. those described in U.S. Pat. No. 3,776,728, and U.S. Pat. No. 4,563,410. Preferred hydrophobizing agents are mercapto-1,3,4-thiadiazoles as described in DE-A 1,228,927 and in U.S. Pat. No. 4,563,410, 2-mercapto-5-alkyl-oxa-3,4-diazoles, 3-mercapto-4-amino-5-alkyl-triazoles and long chain (at least 5 carbon atoms) alkyl substituted mercaptotetrazoles.

A lithographic plate is thus obtained.

According to another preferred embodiment of the present invention a lithographic printing plate can be obtained by means of the DTR-process using an imaging element comprising in the order given a hydrophilic surface of a support, an image receiving layer containing physical development nuclei and a silver halide emulsion layer in water permeable relationship with said image receiving layer.

Said hydrophilic surface of a support is a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

The flexible support is a resin support according to the invention as described above.

The imaging element of the present embodiment may be imaged using a camera-exposure or a scanning exposure as described above followed by a development step in the presence of development agent(s) and silver halide solvent(s) so that a silver image is formed in the physical development nuclei layer. Subsequently the silver halide emulsion layer and any other optional hydrophilic layers are removed by e.g. rinsing the imaged element with water, preferably between 30° C. and 50° C. so that the silver image is exposed.

To facilate the removal of the silver halide emulsion layer it is advantageous to provide a layer between the image-receiving layer and the silver halide emulsion layer comprising a hydrophilic non-proteinic film-forming polymer e.g. polyvinyl alcohol, polymer beads e.g. poly(meth)acrylate beads or mixtures thereof. Such type of layers are disclosed in EP-A-483415 and EP-A-410500.

Finally said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkish red oil may be added.

The following example illustrates the present invention without limiting it thereto. All percentages are by weight unless stated otherwise.

EXAMPLE

Preparation of the silver halide emulsion coating solution.

A silver chlorobromide emulsion composed of 98.2 mole % of chloride and 1.8 mole % of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized by 1-phenyl-5-mercapto-tetrazole.

Preparation of the imaging elements 2 biaxially oriented polyethylene terephthalate film support (giving samples 1 and 2) and 4 biaxially oriented polyethylene 2,6-naphthalenedicarboxylate film supports (giving samples 3 to 6) having a thickness and E-moduli as set out in table 1 and being provided with an adhesion improving layer were each coated with a layer containing gelatin in an amount of 0.4 g/m² and colloidal silica having an average particle diameter of 7 nm in an amount of 0.4 g/m². The adhesion improving layer contained a copolymer of iraconic acid (2%), vinylidene chloride (88%) and methylmethacrylate (10%).

An emulsion prepared as described above was coated to each of these coated polyester film supports together with an anti-halation layer such that the amount of gelatin in the anti-halation layer was 2.7 g/m² and 1.34 g/m² for the silver halide emulsion layer. The amount of silver halide expressed as $AgNO_3$ was 1.25 g/m² and the emulsion layer further contained developing agents and 120 mg/m² of formaldehyde as a hardener. The anti-halation layer further contained a silica matting agent having an average particle size of 3.4 μm and carbon black as anti-halation means.

The thus obtained elements were kept at 57° C. at a relative humidity of 34% for 1 day.

To the thus obtained elements was then coated a surface layer of PdS nuclei serving as physical development nuclei. This surface layer also contained 0.4 g/m² of hydroquinone and 70 mg of formaldehyde. The material was then stored for 1 day at 57° C. at a relative humidity of 34%.

The following alkaline processing solution was prepared:

| | |
|---|---|
| sodium hydroxide (g) | 30 |
| sodium sulphite anh. (g) | 33 |
| potassium thiocyanate (g) | 20 |
| 3-mercapto-4-acetamido-5-n.heptyl-1,2,4-triazole (g) | 0.15 |
| water to make | 1 l |

The following neutralization solution was prepared:

| | |
|---|---|
| citric acid | 10 g |
| sodium citrate | 35 g |
| sodium sulphite anh. | 5 g |
| phenol | 50 mg |
| water to make | 1 l |

The following dampening liquid was prepared:

| | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

Two samples of each of the above described imaging elements were image-wise exposed and processed at 30° C.

with the above described alkaline processing solution, subsequently neutralized at 25° C. with the neutralization solution described above and dried. Six sets of each two printing plates were so obtained.

Of each set, one printing plate was mounted on an offset printing machine (two color GTO printing machine) such that the direction to which the highest E-modulus in table 1 corresponds was perpendicular to the axis of the printing cylinder. The printing press was equipped with a clamp system for mounting the plates. The inks used were commonly employed inks. As a blue ink K+E 4F 473 and as a black ink K+E 125 each available from BASF, were used. During the printing run the described dampening solution was used. The number of copies that had to be disposed of before a steady print could be obtained was evaluated.

The second plate of each set was treated in an identical way except that said printing plate was mounted on said offset printing machine such that the direction to which the lowest E-modulus in table 1 corresponds was perpendicular to the axis of the printing cylinder. The results are listed in the following table:

TABLE 1

| Sample no. | Thickness | E-modulus (N/mm$^2$) max. | E-modulus (N/mm$^2$) min. | Number of copies that had to be disposed of | |
|---|---|---|---|---|---|
| 1 | 100 μm | 4410 | 4230 | 180 | 200 |
| 2 | 200 μm | 4390 | 4190 | 120 | 145 |
| 3 | 100 μm | 5440 | 5110 | 75 | 80 |
| 4 | 100 μm | 5890 | 4590 | 50 | 120 |
| 5 | 200 μm | 5400 | 5060 | 35 | 40 |
| 6 | 200 μm | 5840 | 4550 | 30 | 50 |

It is clear that when using printing plates having a support of polyethylene 2,6-naphthalenedicarboxylate, the number of copies that has to be disposed off at the beginning of the printing is clearly smaller than the number of copies that has to disposed of when using printing plates having a support of polyethylene terephthalate. It is further clear that said number still decreases when using a printing plate having a support of polyethylene 2,6-naphthalenecarboxylate having a thickness of at least 0.15 mm.

We claim:

1. An imaging element having a flexible support and comprising on said support a photosensitive layer comprising a silver halide emulsion and an image-receiving layer comprising physical development nuclei, said layers being in water permeable contact with each other, characterized in that said flexible support is a biaxially oriented polyester film having Young-moduli of at least 9500N/mm$^2$ at least one of said Young-moduli being at least 5100N/mm$^2$, and a thickness between 0.15 mm and 0.35 mm and consisting of polyethylene 2,6-naphthalenedicarboxylate.

2. An imaging element according to claim 1 wherein said polyester film support has a thickness between 0.20 mm and 0.30 mm.

3. An imaging element according to claim 1 wherein in said polyester film the ratio of the Young-modulus in longitudinal direction to Young-modulus in the transverse direction is between 0.8 and 1.2.

4. An imaging element according to claim 1 comprising on a support in the order given a photosensitive layer comprising a silver halide emulsion and an image-receiving layer comprising physical development nuclei, said layers being in waterpermeable contact with each other.

5. An imaging element according to claim 1 comprising on a hydrophilic surface of a support in the order given an image-receiving layer comprising physical development nuclei and a photosensitive layer comprising a silver halide emulsion, said layers being in waterpermeable contact with each other.

6. A method for making a lithographic printing plate comprising the steps of image-wise exposing an imaging element according to claim 1 and subsequently developing a thus obtained imaging element by an alkaline processing liquid in the presence of developing agent(s) and silver halide solvent(s).

\* \* \* \* \*